United States Patent [19]

Ema

[11] Patent Number: 5,014,104
[45] Date of Patent: May 7, 1991

[54] SEMICONDUCTOR INTEGRATED CIRCUIT HAVING CMOS INVERTERS

[75] Inventor: Taiji Ema, Kawasaki, Japan

[73] Assignee: Fujitsu Limited, Kawasaki, Japan

[21] Appl. No.: 600,278

[22] Filed: Oct. 22, 1990

Related U.S. Application Data

[63] Continuation of Ser. No. 297,359, Jan. 13, 1989, abandoned.

[30] Foreign Application Priority Data

Jan. 14, 1988 [JP] Japan .................................. 63-005954

[51] Int. Cl.$^5$ ............................................. H01L 27/02
[52] U.S. Cl. ....................................... 357/42; 357/55; 357/59; 357/67; 357/71
[58] Field of Search ............................................. 357/42

[56] References Cited

U.S. PATENT DOCUMENTS

4,710,897 12/1987 Masuoka et al. ........................ 357/42
4,814,841 3/1989 Masuoka et al. ........................ 357/42

Primary Examiner—Edward J. Wojciechowicz
Attorney, Agent, or Firm—Armstrong, Nikaido, Marmelstein, Kubovcik & Murray

[57] ABSTRACT

A CMOS inverter which comprises a series of connected p-channel and n-channel MOS FETs of which gate electrodes, drain contact electrodes, and voltage source lines are arranged on different insulation layers stacked on each other. The drain contact electrodes are formed by a conductor, including a silicide of high melting point metal, such as, tungsten or molybdenum. They are coated by an insulation layer over which the voltage source lines and signal lines for transferring output to a succeeding stage are arranged. By doing so, the device area is decreased, and the substrate can be reflowed to smooth the surface of the insulator so as to prevent disconnecting of the wirings.

8 Claims, 5 Drawing Sheets

SEMICONDUCTOR INTEGRATED CIRCUIT HAVING CMOS INVERTERS

This application is a continuation of application Ser. No. 297,359 filed Jan. 13, 1989 now abandoned.

BACKGROUND OF THE INVENTION

This invention generally relates to a semiconductor integrated circuit. More particularly, this invention relates to a circuit having complementary metal oxide semiconductor type inverters.

Metal oxide semiconductor (MOS) type field effect transistors (FETs) are widely used in integrated circuits (ICs), especially complementary MOS (CMOS) FETs which are used for inverters having various circuits, such as a peripheral circuit of a dynamic random access memory (DRAM) device.

Figure 1A:
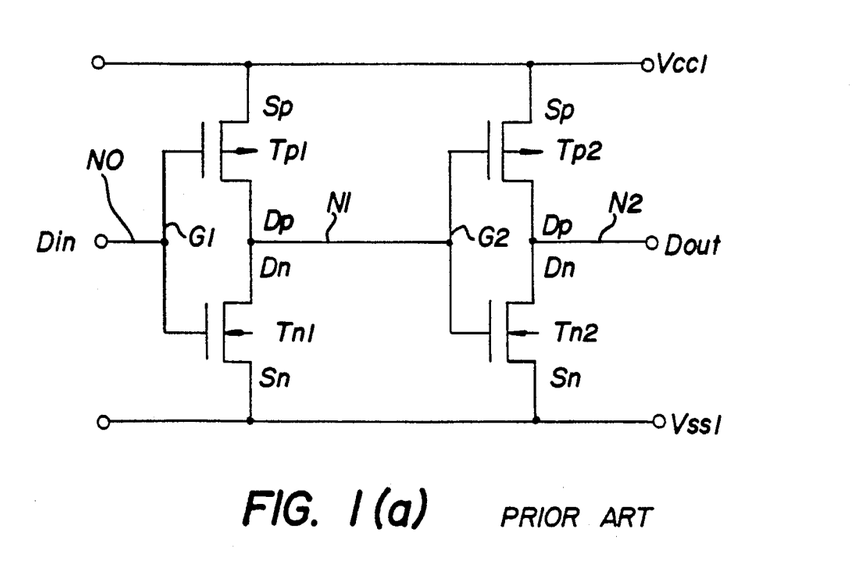
FIG. 1(a) is a circuit diagram of a conventional double stage inverter circuit.

FIG. 1(a) shows a circuit diagram of a double stage inverter circuit. The first stage is composed of a p channel FET Tp1, and an n channel FET Tn1. The FETs are connected in series between a positive voltage source line Vcc1 and a negative voltage source line Vss1. The gate electrodes of these transistors are connected to each other, and G1 a first junction point of these gates is connected to an input terminal Din. The source electrodes Sp and Sn of these transistors are respectively connected to the Vcc1 or Vss1, while the drain electrodes Dp and Dn of these FETs are connected to each other, and outputs an inverted signal to a first output signal line N1 which feeds the inverted signal to the second stage inverter. The second stage inverter is also composed of a p channel FET Tp2 and an n channel FET Tn2. These transistors are connected similarly to the first inverter. These transistors receive the inverted signal from the first signal line N1 at a second junction point G2, and output the signal to a second output signal line N2 which is connected to an output terminal Dout. The second voltage source line Vss1 is usually grounded.

Figure 1B:
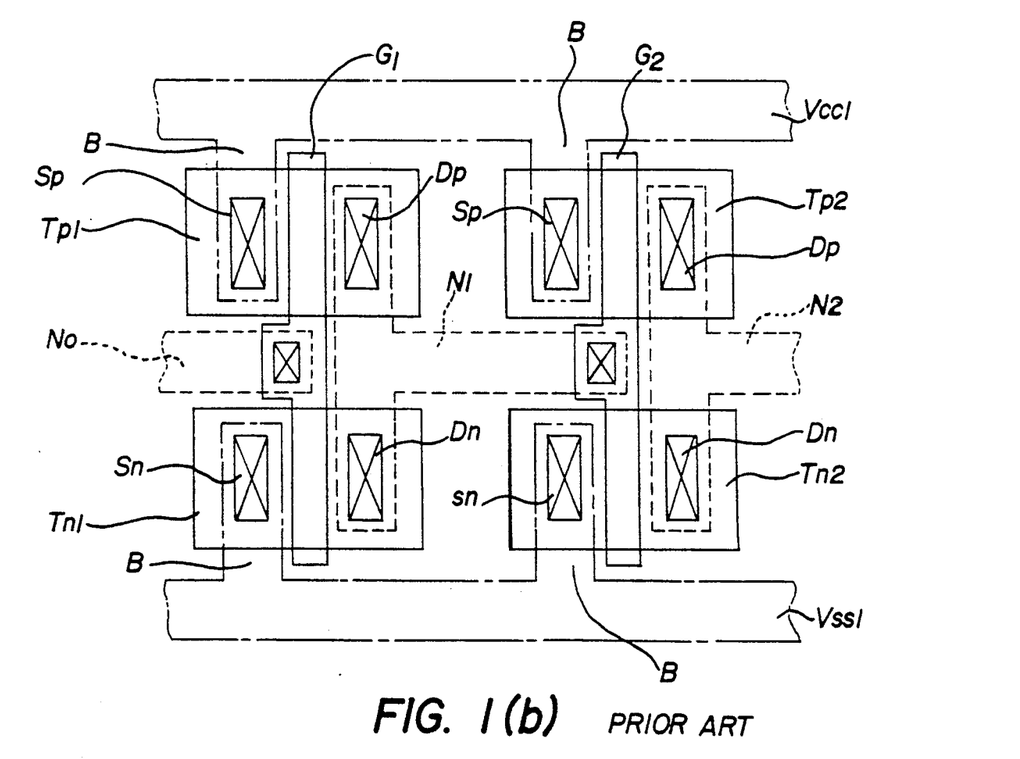
FIG. 1(b) is a schematic plan view illustrating an exemplary arrangement of elemental devices on an IC chip showing a portion of a double stage inverter circuit shown in FIG. 1(a).

FIG. 1(b) is a schematic plan view illustrating an exemplary arrangement of elemental devices on an IC chip showing a portion of a double stage inverter circuit, as shown in FIG. 1(a). The p-channel FETs Tp1, Tp2 and the n-channel FETs Tn1, Tn2 are formed in a semiconductor substrate. These FETs are separated from each other by a field oxide layer and coated by a gate oxide layer. The insulation layers are not shown in FIG. 1(b), but they can be considered to be coating for the entire surface of the substrate. The gate electrodes G1 and G2 are usually formed with a doped polysilicon layer deposited on the gate oxide layer. The entire surface of the substrate is further coated with an insulation layer, such as, silicon dioxide (SiO$_2$) which will be called first insulation layer hereinafter. The first insulation layer is also not shown in FIG. 1(b) because it is coating for the entire surface of the substrate. The voltage source lines Vcc1, Vss1 and the signal lines N0, N1, N2 are formed over the first insulation layer by patterning an aluminum film, for example. They are respectively identified in FIG. 1(b) with a double dot chain line, a single dot chain line and broken lines. These wiring patterns are connected to corresponding electrodes Sp, Sn, Dp, Dn, G1, G2 through respective contact holes formed through the insulation layers. These contact holes are identified by cross hatched areas in FIG. 1(b).

The configurations inverter circuits cause several problems when packing density of the elemental devices in the IC becomes high. Generally, the voltage source lines Vcc1 and Vss1 are required to be wider compared to other wiring lines, such as, G1, G2 or N0, N1, N2 because voltage source lines have to carry a larger current than those of other wiring lines. If the aluminum wiring lines are made too narrow, the current density in the wiring line increases which causes electro-migration of aluminum, and the reliability of the device decreases; thereby, reducing the size of the device. Further, as can be seen in FIG. 1(b), the voltage source lines Vcc1, Vss1 and the signal lines N0, N1, N2 are formed on a same layer (the first insulation layer) with the same aluminum film. Accordingly, the Vcc1 or Vss1 lines must be arranged in an outside area of the device, and extended branch members B toward the inside of the device in order to contact with respective electrodes Sp or Sn since the voltage source lines Vcc1, Vss1 have to be separated from the signal lines N0, N1, N2 which are arranged at the center part of the device. Accordingly, a limitation on the design to reduce the size of the device size is set.

SUMMARY OF THE INVENTION

The object of the present invention, therefore, is to provide an improved configuration for CMOS inverter to reduce the size of the device.

A further object of the present invention is to increase the packing density of a semiconductor IC having CMOS inverters.

A further object of the present invention is to wire the voltage source lines for the CMOS on a layer separated from other wiring lines.

According to the present invention, the wirings for connecting the drain regions of the CMOS FETs to the gate electrodes of the next stage are formed on the first insulation layer which covers the gate electrodes. A second insulation layer is formed over the entire surface of the device, and the voltage source lines are formed on the second insulation layer. Therefore, the voltage source lines are separated from other wiring lines, and these layers are stacked on each other.

The above structural arrangement enables the design of the voltage source lines to be wider than those of the prior art so that the resistivity of the line is reduced while the current density in the line is reduced, and the electro-migration of aluminum is avoided. Further, the above-structural arrangement enables the voltage source lines, which have been arranged on the outer peripheral of the device area, to be arranged over the FETs. Accordingly, the size of the device can be decreased.

In another embodiment, the wiring for connecting the drain regions are separated into two parts, and the signal line for connecting the drain contact electrodes to the succeeding stage is also formed on the second insulation layer, as well as the voltage source lines. This further increases the production yield of the device by preventing a diffusion of impurities in the drain contact lines.

One feature of the present invention is the wiring lines which connect the drain regions of the CMOS inverter are made of a material which includes a high melting point silicide layer. Using the high melting point silicide layer for the connection of drain region, it becomes possible to treat the device in a high temperature so that the reflowing process, for example, can be applied to increase the reliability of the device.

Further, the high melting point silicide layer used in this invention is not formed for exclusively wiring the gate electrodes of the CMOS inverter. Such a silicide wiring is widely used in recent ICs. For example, bit lines of various memory devices are formed with silicide, and CMOS inverters of the present invention can be used for a peripheral circuit of such memory devices. Therefore, in most cases, the present invention can utilize such a previously formed silicide layer in the IC. Consequently, in most cases, the fabrication process of the present invention does not require additional process steps for fabricating the IC which is another advantage of the present invention.

These and other advantages of the invention will become more apparent in the description of preferred embodiments to follow, which will be described referring to the attached drawings.

DESCRIPTION OF PREFERRED EMBODIMENTS

Figure 2A:
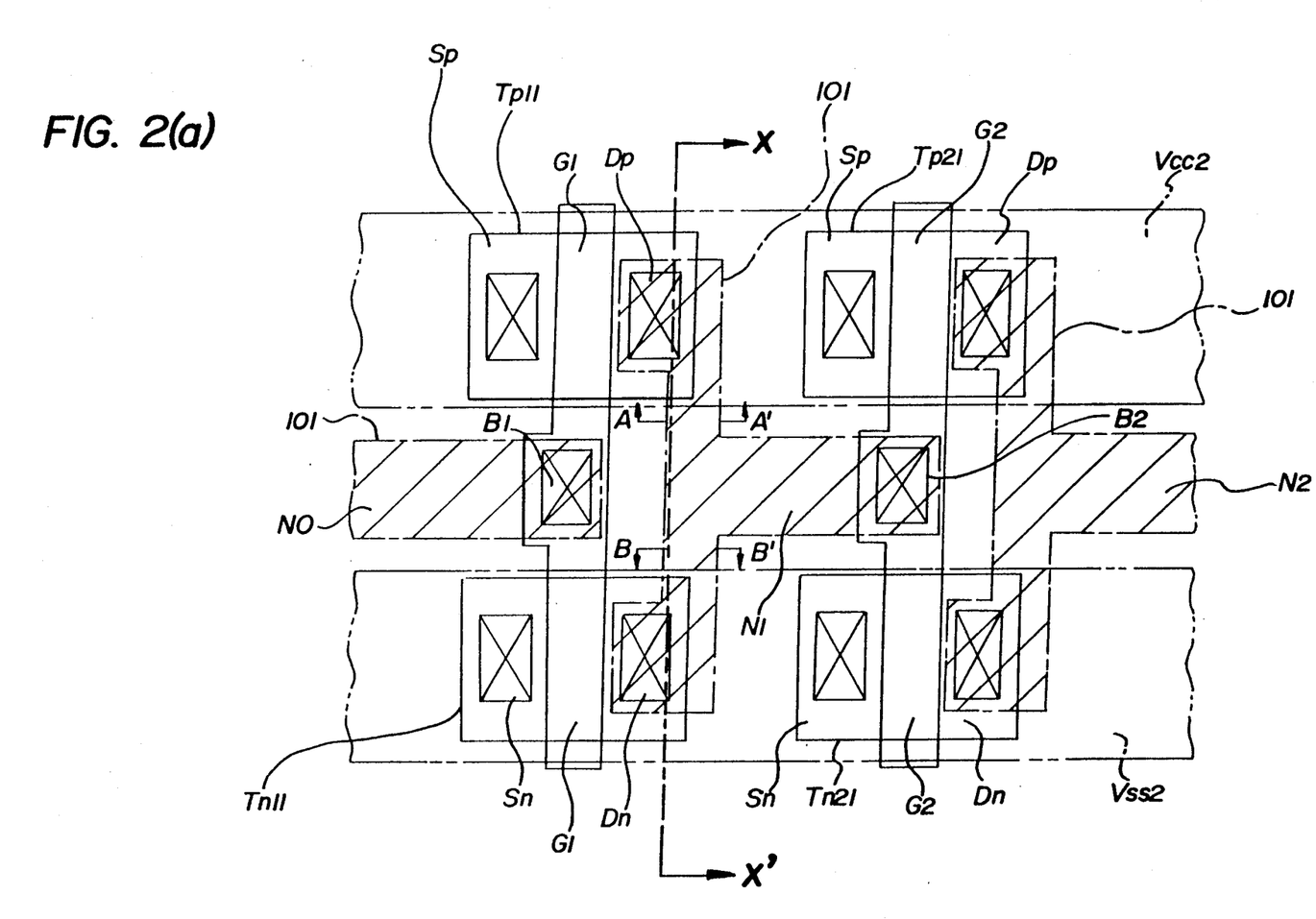
FIG. 2(a) is a schematic plan view of a first embodiment of the present invention showing a portion of an IC chip corresponding to a double stage inverter shown in FIG. 1(a) illustrating an arrangement of the elemental devices.

Advantages and features of the present invention will be described referring to preferred embodiments. FIG. 2(a) is a plan view of a semiconductor substrate of a first embodiment showing a new arrangement of elemental devices for a double stage inverter wherein the circuit diagram is shown in FIG. 1(a). Compared to the prior art device of FIG. 1(b), the first and second voltage source lines Vcc2, Vss2 are formed respectively over the p-channel FETs Tp11, Tp21, and n-channel FETs Tn11, Tn21.

Figure 2B:
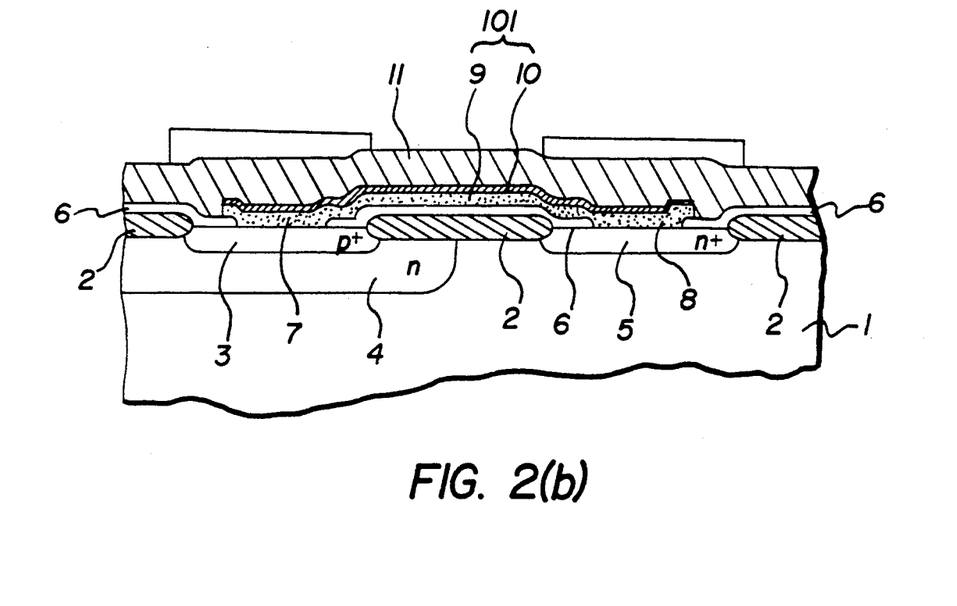
FIG. 2(b) is a schematic cross-sectional view of the device of FIG. 2(a) taken in the direction of arrows XX' of FIG. 2(a).

Such an arrangement becomes possible by forming the voltage source lines on a layer which is separated from the layer which carries the signal lines N0, N1, N2. FIG. 2(b) shows a cross-section of the device taken along a line XX' of FIG. 2(a). A silicon substrate 1 of this embodiment has a p-type conductivity. Reference numeral 2 designates field oxide layers which separate the elemental devices from each other. In FIG. 2(b), a typical structure of FET is not shown since the cross-sectional line XX' is running in parallel to the gate electrode G1 of the p-channel FET Tp11 and n-channel FET Tn11. Drain region 3 (Dp) of the p-channel FET Tp11 is highly doped with a p-type impurity, and formed in an n-type well region 4. The drain region 5 (Dn) for the n-channel FET Tn11 is highly doped with an n-type impurity. The gate electrode G1 is formed on a gate oxide layer (not shown). The gate and channel portions of the FETs are also not shown in the cross-section of FIG. 2(a). The entire surface of the substrate is coated by the first insulation layer 6. Contact holes 7, 8 are opened in the first insulation layer 6 respectively over the drain regions 3, 5 of the FETs Tp11, Tn11. Contact electrodes for the drain regions and signal lines (N1) are formed on the first insulation layer 6. These wirings are designated 101 in FIG. 2(b).

One feature of the present invention is that the contact electrodes and signal line N1 are composed of a high melting point material, including a silicide of high melting point metal, such as molybdenum, tungsten, or the like. As can be seen in FIG. 2(b), the high melting point conductive layer 101 is composed of a double layer of polysilicon layer 9 and silicide layer 10. The advantage of such a structure will later be described. The signal line N1 is connected to the gate electrode G2 of the second stage FETs through a common contact hole B2 (see FIG. 2(a)) formed in the first insulation layer 6. In a similar manner, the drain electrodes of the inverter FETs are connected to the common contact point of the next stage inverter.

The entire surface of the substrate is further coated with a second insulation layer 11 (FIG. 2(b)). The second insulation layer is composed of phosphosilicate glass (PSG). The second insulation layer may be replaced with other material, such as, boronsilicate glass (BSG), for example. The voltage source lines Vcc2 and Vss2 are formed over the second insulation layer 11. Since the layer of the voltage source line and the layer of signal lines are separated from each other by the second insulation layer 11, it is possible to arrange the Vcc2 and Vss2 lines over the transistors Tp11, Tp21 or Tn11, Tn21, respectively, as can be seen in FIG. 2(a). Accordingly, the area of the device can be reduced when compared to that of the prior art device of FIG. 1(b).

As mentioned above, one feature of the present invention is to form the connection of drain electrodes of p-channel and n-channel FETs (Dp and Dn) to the gate electrode of the next stage FETs with a high melting point material, including silicide of high melting point metal. In this embodiment, the connection is done with a double layer of polysilicon layer 9 and silicide layer 10. These connections are identified in FIG. 2(a) by hatching. In order to obtain a good Ohmic contact to the drain regions Dp and Dn, the portions of the pattern of the connection lines contacting the drain region are highly doped with an impurity of respective conductivity. For example, the portion of the connection line from a line shown by an arrow AA' toward the drain Dp is doped, for example, by a p-type impurity by ion implantation while the portion from the arrows BB' toward the drain Dn is ion-implanted with an n-type impurity.

Coated over the polysilicon layer 9 is a silicide layer 10 of high melting point metal, such as tungsten or molybdenum, and patterned as shown in FIG. 2(a). With this silicide layer 10, the conductivity of the signal line is increased. Compared to prior art device of FIG. 1(b) wherein signal lines are formed with aluminum, the signal lines of the embodiment of this invention are formed with high melting point materials, such as polysilicon and silicide; thus, enabling the treatment of the substrate with a higher temperature as in the following fabrication process. For example, the second insulation layer 11 made of PSG can be "reflowed" after the contact holes B1, B2 are formed. The contact holes formed in the PSG layer are sharp edged; thus, if wirings are done directly on the PSG layer, the wirings are sometimes disconnected. However, after the contact holes are formed, the PSG layer can be heated, for example up to 950° C. for 30 min. By this heat treatment the edge of the contact holes are smooth out. This treatment is called reflow process in the art. Therefore, the disconnection of the wiring is avoided, and the reliability of the device is increased.

The processes for fabricating the device of the above embodiment will be described briefly in order to get a more clear understanding of the present invention. The processes used are all conventional in the art. Various modifications will be possible; therefore, the present invention is not restricted to the process described herein.

On the surface of the substrate 1, the field oxide layer 2 is patterned by photolithography in order to define the active regions of each transistors. The well regions 4, drain regions Dp, Dn and source regions Sp, Sn are formed by, for example, selective diffusion using photolithography. The gate oxide film (not shown) is formed over the channel region of FETs, and gate electrodes G1, G2 are formed over it with polysilicon. These processes are all common in the art. The first insulation layer 6 of silicon dioxide, for example, is coated over the entire surface of the device by chemical vapor deposition (CVD). Contact holes B1, B2 for the gate electrodes are formed by photolithography. The polysilicon layer 9 and silicide layer 10 are successively formed over the first insulation layer, and patterned as shown by hatched area in FIG. 2(a). The portions corresponding to the drain regions are ion-implanted. The second insulation layer of PSG is formed over entire surface of the device. The contact holes for source regions of FETs and gate electrodes G1, G2 are formed, and reflowed. Then, the aluminum wiring for the voltage source lines are formed over the second insulation layer and patterned as shown in FIG. 2(a).

Figure 3A:
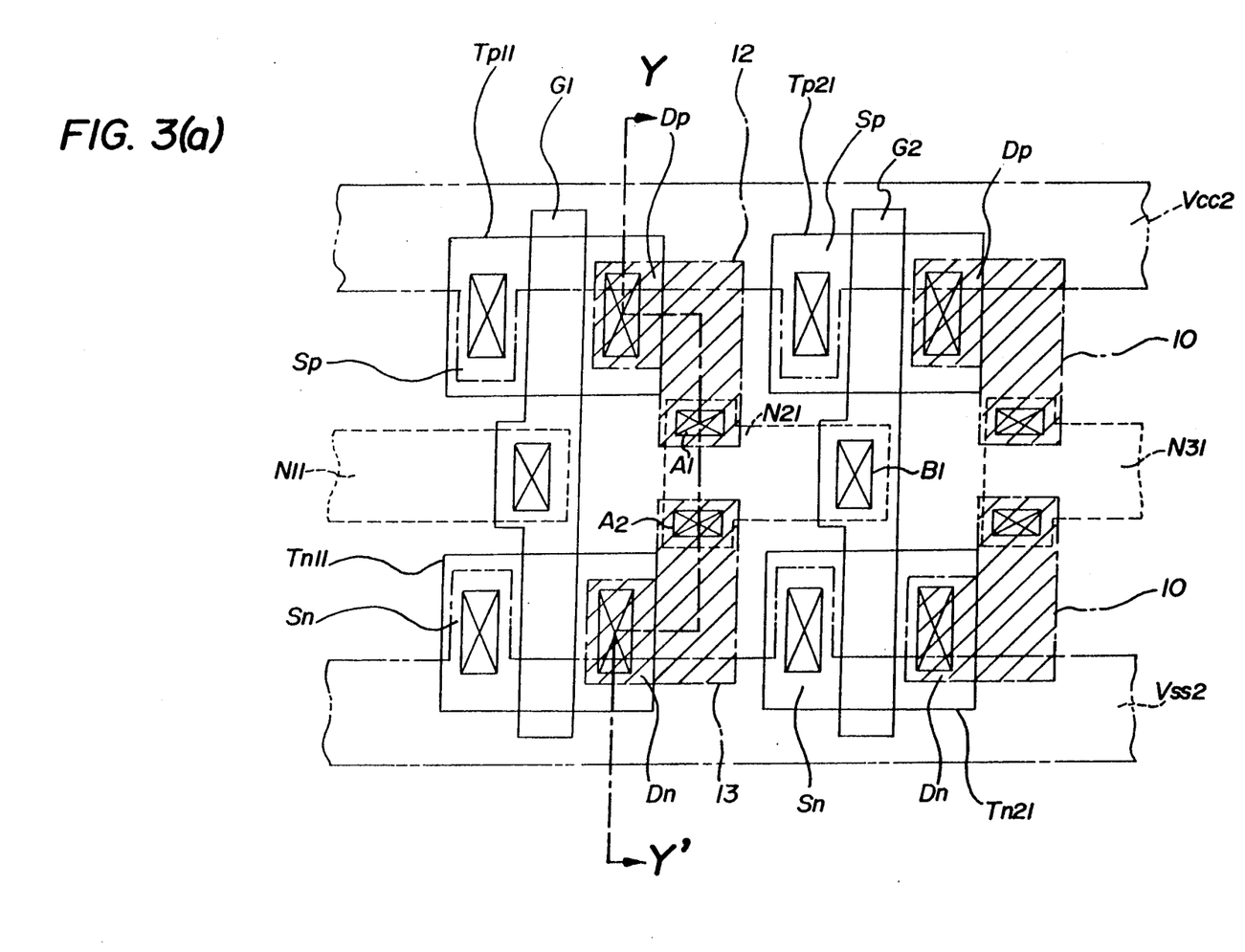
FIG. 3(a) is a schematic plan view of a second embodiment of the present invention showing a portion corresponding to FIG. 2(a).
Figure 3B:
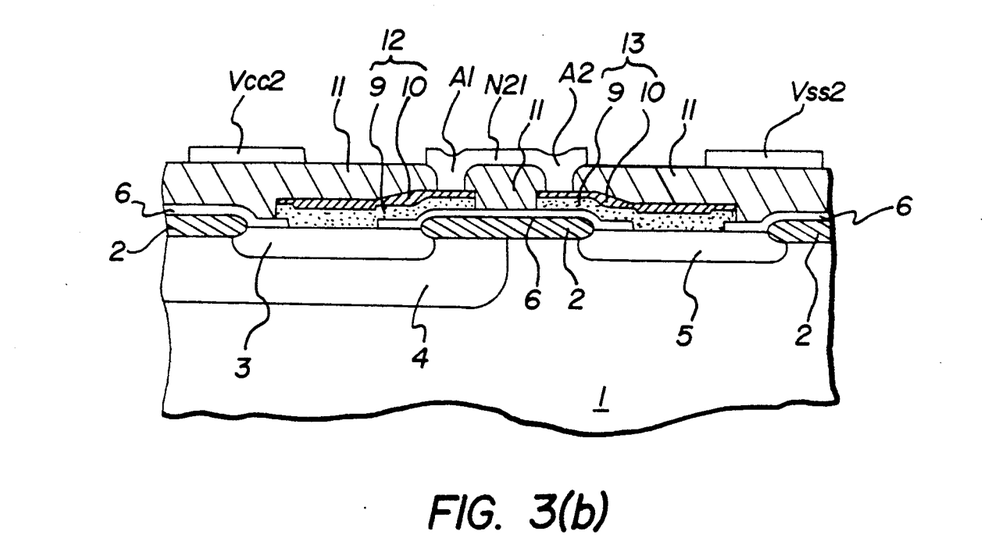
FIG. 3(b) is a cross-sectional view of the device of FIG. 3(a) taken along line YY' of FIG. 3(a).

Next, a second embodiment of the present invention will be described in reference to FIG. 3. FIG. 3(a) is a plan view of the device showing the arrangement of elemental devices on the substrate, and FIG. 3(b) is a schematic cross-sectional view taken along line YY' of FIG. 3(a). When comparing FIG. 3(a) with FIG. 2(a), it is shown that the contact electrodes (hatched in FIG. 3(a)) connecting the drain regions Dp and Dn of the CMOS FETs are divided into two parts at its center part. More precisely, the contact electrode 12 for the drain region Dp of the p-channel FET Tp11 and the contact electrode 13 for the drain region Dn of the n-channel FET are separated from each other. In this embodiment, the contact electrodes 12 and 13 are formed on the first insulation layer 6, while the signal line N21 which connects the drain regions to the gate electrode of the next stage is formed on the second insulation layer 11 as well as the voltage lines Vcc2, Vss2. The contact electrode 12 is connected to the signal line N21 through a contact hole A1 formed in the second insulation layer 6. Similarly, the contact electrode 13 is connected to N21 through a contact hole A2. Therefore, the contact electrodes 12 and 13 are connected to each other via the signal line N21. The signal line N21 is connected to the gate electrode G2 of the second stage inverter FETs through a contact hole B1. Other stages of the inverters are similarly connected.

The above structural arrangement will become more apparent from FIG. 3(b). The configuration beneath the first insulation layer 6 is similar to that of FIG. 2(b); thus, the same reference numerals designate the same parts. The contact electrodes 12 and 13 for respective drain regions 3 and 5 are separated from each other. They are composed of a double layer of a polysilicon layer 9 and a silicide layer 10, and formed over the first insulation layer 6. The second insulation layer 11 made of PSG film, for example, is formed over the entire substrate. Over the second insulation layer 11 is formed the voltage source lines Vcc2, Vss2, and the signal line N21. The signal line N21 is connected to the contact electrodes 12 and 13 through respective contact holes A1 and A2, which are formed in the second insulation layer 11.

In such a manner, the drain contact electrodes for p-type FET Tp11 and n-type FET Tn11 are separated from each other, but they are electrically connected to each other by the signal line N21. Such separation of the contact electrode has a significant effect for increasing the reliability of the device. In the structure of FIG. 1(b), it is sometimes found that the p- and n-type impurities diffuse into the polysilicon layer 9 from p- and n-type drain regions, and contaminate each other to cause a degradation of the characteristics of the FETs. Such diffusion effect is further emphasized by ion implantation of p- and n-type impurities into the end portion of the polysilicon layer 9 (to the portion shown by arrows AA' and BB' in FIG. 2(a)). In comparing FIGS. 2(a) and 3(a), it can be seen that the diffusion path of the impurities is elongated from the straight line XX' to the broken line YY', and further the contact electrode has been divided into two parts. Thus, the diffusion of the impurities has been perfectly avoided, and the operation of the device is stabilized.

As described above, one feature of the present invention is using a high melting point wiring lines which includes a layer of polysilicon and silicide of high melting point metals, such as molybdenum, tungsten, or the like. The just-described high melting point layers are widely used in recent ICs. Accordingly, the process for fabricating those embodiments described above can utilize these layers, and in most cases, the additional process is not necessary for fabricating the devices of the present invention into IC chips. Some examples will be described below.

Figure 4:
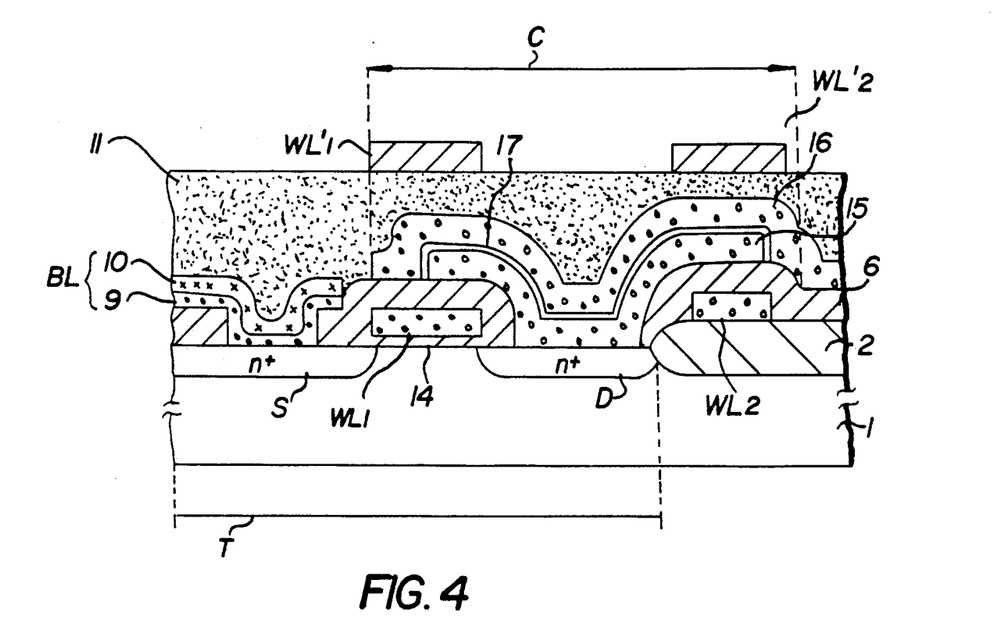
FIG. 4 is a partial cross sectional view of a DRAM cell of the present invention.

FIG. 4 is a schematic cross-sectional view of a typical dynamic random access memory (DRAM) device for which the present invention is applicable. On a silicon substrate 1 is formed a field insulation layer 2, while drain region D and source region S are fabricated. A gate electrode WL1 is formed on a gate oxide layer 14, and a word line WL2 is formed on the field layer 2. A first insulation layer 6 is formed over the entire surface of the substrate. Contacting the drain region D is a drain contact electrode 15 which has a capacitor C between a storage electrode 16 which is separated from the drain contact electrode 15 by an insulation film 17. Contacting the source region S is a bit line BL which is composed of a double layer of a polysilicon layer 9 and a high melting point silicide layer 10. The bit line BL is extended to the left of the figure. These electrodes and wires are covered with a second insulation layer 11 of PSG. Over the second insulation layer 11 is formed a word line pair WL1' and WL2'. These word lines are running vertically to the surface of the sheet, and are respectively connected to the gate electrodes WL1 and word line WL2 at proper portions of the chip.

These configurations are conventional devices which embody recent DRAM devices. It should be noted that the polysilicon layer 9 and silicide layer 10 are formed in a similar manner as those shown in FIG. 2(b) and 3(b). Further, such DRAM devices always need CMOS inverters in their peripheral circuit. Therefore, the CMOS inverter of the present invention can be fabricated utilizing these layers of the conventional DRAM devices. In other words, the drain contact electrodes of the present invention can be fabricated with the same process steps of fabricating the double layer of polysilicon and silicide using the same mask and etching process. Therefore, the fabrication process for the present invention does not need any additional fabrication process when compared to the fabrication of ordinary DRAM devices. However, with the present invention, the device size of the CMOS devices can be reduced, and the reliability of the device is increased. This is another advantage of the present invention over the prior art devices.

Figure 5:
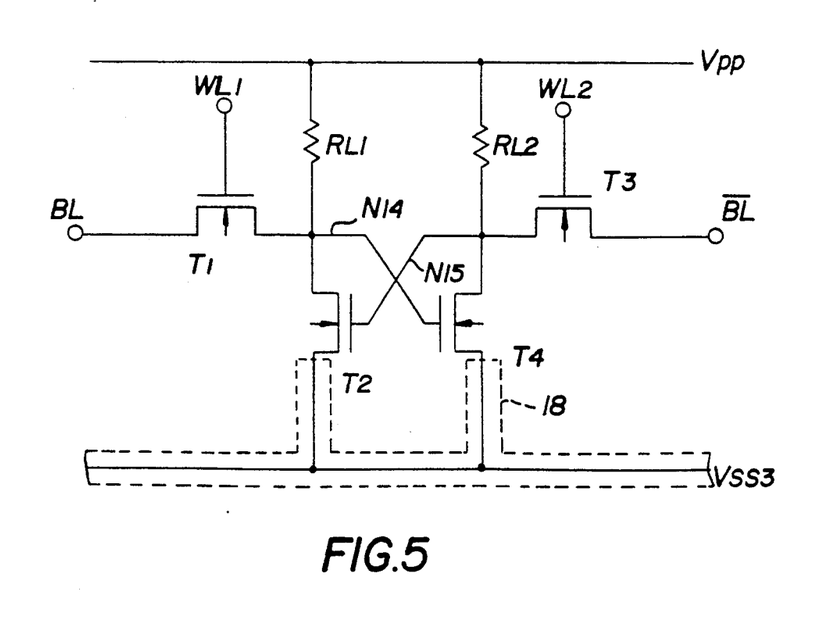
FIG. 5 is a circuit diagram of a memory cell of the present invention.

FIG. 5 is a circuit diagram of a second example of an IC to which the present invention is applicable. This circuit is a typical latch type static memory cell composed of four MOS FETs and a pair of load resistors. In the FIG. 5, T1-T4 are n-channel FETs, for example, and RL1 and RL2 are a pair of load resistors connected between a voltage source line $V_{DD}$ and junction points of FETs T1-T4 and T3-T2. BL, $\overline{BL}$ and WL1, WL2 are respectively a pair of bit lines and word lines. N14 and N15 designate signal lines respectively which connect the gate electrodes of T2 and T4 to the junction points of the FETs. In recent ICs, the voltage source line Vss3 which is encircled with a broken line 18 is composed of a double layer of polysilicon and silicide. The peripheral circuit of such memory cell also uses CMOS inverters. Therefore, it will be easily understood that the structure of the present invention is applicable without needing additional process steps.

As has been described above, the structure of a CMOS inverter is applicable to many of ICs, and reduces the device size and improves the reliability of the device. In most cases, the fabrication process for such CMOS inverter does not need any additional steps or processes.

The invention has been disclosed referring to some preferred embodiments and applicable circuits. But the invention is not restricted to these applications and processes or materials described in this disclosure.

Moreover, while the invention has been particularly shown and described in reference to preferred embodiments thereof, it will be understood by those skilled in the art that changes in form and details may be made herein without departing from the spirit and scope of the invention.

I claim:

1. A semiconductor integrated circuit having a complementary metal oxide semiconductor type inverter, said inverter comprising:
    first and second voltage source lines for supplying source voltage to said inverter; and
    a pair of p-channel and n-channel metal oxide semiconductor type field effect transistors, said MOS FETs are connected to each other in series between said first and second voltage source lines, gates of each of said MOS FETs are connected to each other with a gate electrode for commonly receiving an input signal, source region of said p-channel MOS FET is connected to said first voltage source line, source region of said n-channel MOS FET is connected to said second voltage source line, and drains of said p-channel MOS FET and n-channel MOS FET are connected to each other,
    wherein one of said drains of p-channel MOS FET and n-channel MOS FET is contacted to a separate drain contact electrode, wherein another one of said drains of p-channel MOS FET and n-channel MOS FET is contacted to another separate drain contact electrode, wherein said drain contact electrodes comprise a conductor material including a silicide of high melting point metal, and wherein said drain contact electrodes are connected to each other with a conductor metal; and
    wherein said first and second voltage source lines, and said conductor material are arranged over an insulation layer covering other elements of the inverter.

2. A semiconductor integrated circuit as set forth in claim 1, further comprising a first insulation layer and a second insulation layer,
    wherein said first and second drain contact electrodes are arranged on a first insulation layer which covers said gate electrode and said p-channel and n-channel MOS FETs; and
    wherein said first and second voltage source lines, and said conductor metal are arranged on a second insulation layer which covers said first and second contact electrodes and said first insulation layer.

3. A semiconductor integrated circuit as set forth in claim 1, wherein said silicide is composed of silicon and metals which is selected from the group consisting of tungsten and molybdenum.

4. A semiconductor integrate circuit as set forth in claim 2, wherein said conductor metal comprises a signal line for transferring output signal of said inverter to a succeeding stage circuit of said inverter.

5. A semiconductor integrated circuit as set forth in claim 2, wherein said first insulation layer is a silicon dioxide layer, and said second insulation layer is a layer having a material selected from the group consisting of reflowed phosphosilicate glass and reflowed borophosphosilicate glass.

6. A semiconductor integrated circuit device, comprising:
    a memory cell array;
    a logic circuit having a complementary metal oxide semiconductor (CMOS) type inverter, wherein said inverter comprises:
    first and second voltage source lines for supplying source voltage to said inverter,
    a pair of p-channel and n-channel metal oxide semiconductor type field effect transistors, wherein said MOS FETs are connected to each other in series between said first and second voltage source lines, said first and second voltage source lines being arranged over said p-channel and n-channel MOS FETs, respectively, and wherein respective gates of each of said MOS FETs are connected to each other with a gate electrode for commonly receiving an input signal, source region of said p-channel MOS FET being connected to said first voltage line, source region of said n-channel MOS FETs connected to said second voltage source line, and drains of said p-channel MOS FET and n-channel MOS FET being connected to each other with a drain contact electrode, wherein said drain contact electrode comprises a conductor material including a silicide of high melting point metal, and wherein said first and second voltage source lines are arranged over an insulation layer covering other elements of the inverter;

a wiring connecting said memory cell and a connecting electrode of said inverter, said wiring being constructed with the same conductive layer.

7. A semiconductor integrated circuit device as in claim 6, wherein said memory cell is a DRAM cell and said wiring is bit lines.

8. A semiconductor integrated circuit device as in claim 6, wherein said memory cell is a SRAM cell and said wiring is a ground line.

* * * * *